United States Patent
Drusenthal

(10) Patent No.: US 6,806,749 B2
(45) Date of Patent: Oct. 19, 2004

(54) CIRCUIT ARRANGEMENT AND METHOD FOR GENERATING A TIME-LIMITED SIGNAL

(75) Inventor: Ullrich Drusenthal, Heilbronn (DE)

(73) Assignee: Atmel Germany GmbH, Heilbronn (DE)

(*) Notice: Subject to any disclaimer, the term of this patent is extended or adjusted under 35 U.S.C. 154(b) by 0 days.

(21) Appl. No.: 10/242,880

(22) Filed: Sep. 12, 2002

(65) Prior Publication Data

US 2003/0058033 A1 Mar. 27, 2003

(30) Foreign Application Priority Data

Sep. 24, 2001 (DE) .......................................... 101 46 831

(51) Int. Cl.[7] .......................... H03K 17/22; H03K 3/355
(52) U.S. Cl. ......................... 327/143; 327/198; 327/227
(58) Field of Search ................................ 327/143, 198, 327/227, 544, 545, 546

(56) References Cited

U.S. PATENT DOCUMENTS

| | | | | |
|---|---|---|---|---|
| 4,405,871 A | * | 9/1983 | Buurma et al. ............. | 327/143 |
| 4,409,501 A | | 10/1983 | Eickerman et al. .......... | 327/143 |
| 5,017,803 A | * | 5/1991 | Yoshida ....................... | 327/546 |
| 5,321,317 A | * | 6/1994 | Pascucci et al. ............ | 327/143 |
| 5,612,641 A | * | 3/1997 | Sali ............................. | 327/143 |
| 5,812,001 A | | 9/1998 | Imamiya ...................... | 327/198 |

FOREIGN PATENT DOCUMENTS

| | | | | |
|---|---|---|---|---|
| DE | 10024980 | | 11/2001 | .......... H03K/17/22 |
| WO | WO 99/27652 | | 6/1999 | ............. H03L/7/00 |

* cited by examiner

Primary Examiner—Timothy P. Callahan
Assistant Examiner—Terry L. Englund
(74) Attorney, Agent, or Firm—W. F. Fasse; W. G. Fasse

(57) ABSTRACT

A circuit includes a second switching unit, a first switching unit that is connected to and selectively actuates the second switching unit, and a capacitive voltage divider including first, second and third capacitances connected in series. The first and second switching units are connected respectively to first and second junctions between the first and second and the second and third capacitances respectively. An associated method involves applying a supply voltage to the voltage divider so as to charge the first and second junctions, discharging the first junction through the first switching unit, which, dependent on the voltage of the first junction, selectively actuates the second switching unit to supply an additional charging current to the second junction. A time-limited signal such as a power-on reset signal is tapped from the first or second switching unit or from the second junction. Thereafter, the circuit draws no further current.

33 Claims, 3 Drawing Sheets

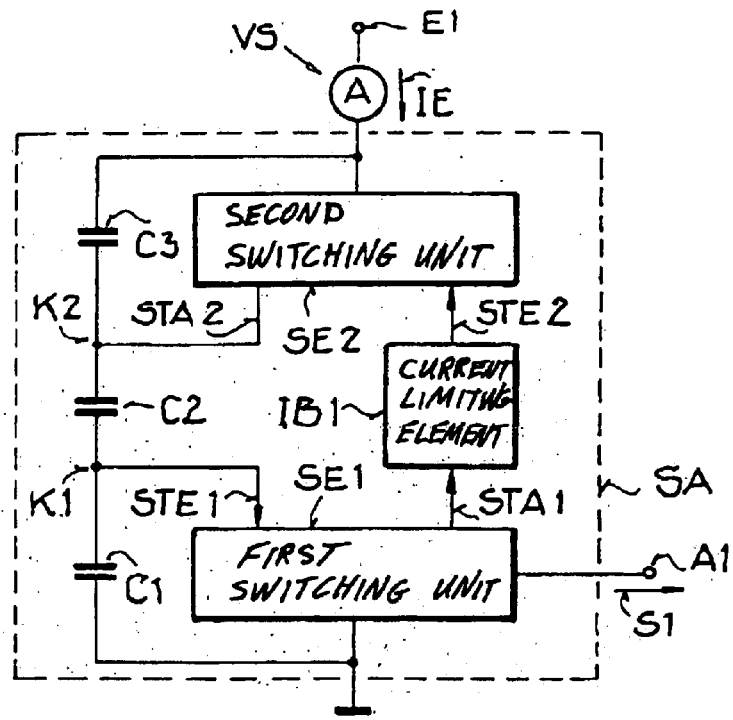
FIG. 1a
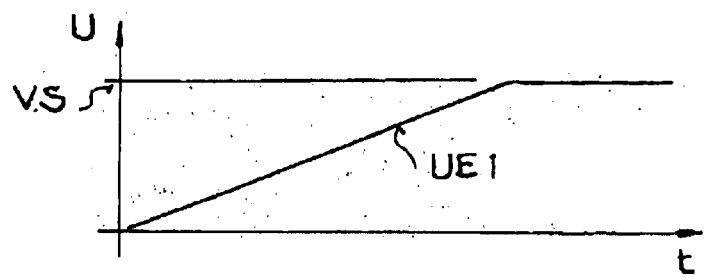
FIG. 1b
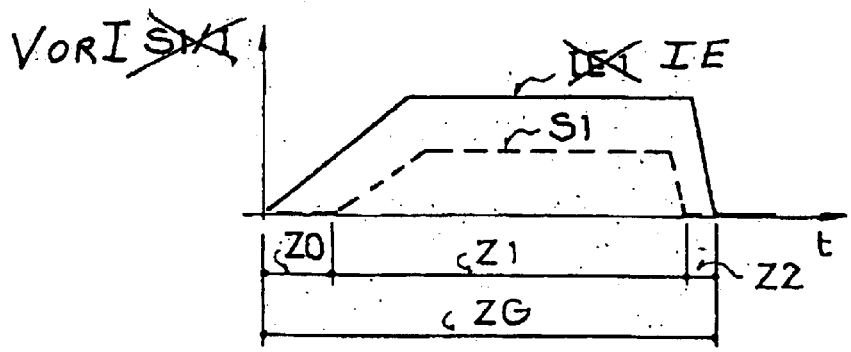

CIRCUIT ARRANGEMENT AND METHOD FOR GENERATING A TIME-LIMITED SIGNAL

BACKGROUND

1. Field of the Invention

The present invention relates to a circuit arrangement and a method for generating a time-limited signal, such as for a power-on reset.

2. Description of the Related Technology

A method of this kind is known from the publication DE 100 24 980.9. After providing a supply voltage, an initialization signal (Power-on-Reset) is generated for a following circuit arrangement. A disadvantage is that the method calls for an elaborate circuit arrangement that requires a large chip surface and that the circuit arrangement continues to consume electric current after the reset signal has been generated.

In general, methods for generating a time-limited signal are used, for example, by so-called "reset" or "initialization" signals in order to set defined electrical parameters or initial states in circuit arrangements after applying a supply voltage. Another important application of signals of limited duration is the change of states while an electrical circuit arrangement is in operation. Furthermore, it is important to develop methods for circuit arrangements that should have a low operating current or consume little current in the quiescent state in order, for instance, to keep the discharge rate of a battery low. In particular in applications in motor vehicles with the 42 volt vehicle electrical system, it is important for these arrangements to consume little current even where there are high supply voltages.

SUMMARY OF THE INVENTION

The object of the present invention is to specify a method for generating a time-limited signal that reduces the current consumption in a circuit arrangement. Another object of the invention is to specify a circuit arrangement for performing the method that can be produced by simple means and at low cost.

The above objects have been achieved according to the invention in a method of generating a time-limited signal, comprising the steps:

a) applying a supply voltage to a capacitive voltage divider including first and second divider junctions between first, second and third capacitances in series, thereby charging the voltage divider while establishing a first voltage at the first divider junction and a second voltage at the second divider junction;

b) at least partially discharging the first divider junction;

c) in response to and dependent on a varying first voltage level of the first voltage being no less than a first voltage threshold, selectively applying an additional charging current to the second divider junction in addition to the charging of the voltage divider; and d) generating a time-limited signal in response to and dependent on at least one of:
 i) the first voltage level of the first voltage, and
 ii) a charging rate of a second voltage level of the second voltage.

The above objects have further been achieved according to the invention in a circuit arrangement for generating a time-limited signal at a circuit signal output thereof, the circuit arrangement comprising:

a first circuit terminal, a second circuit terminal, and the circuit signal output;

a first switching unit including a first current input, a first current output, and a first actuating terminal;

a second switching unit including a second current input, a second current output, and a second actuating terminal; and a capacitive voltage divider including first, second and third capacitances that are connected in series with one another between the first circuit terminal and the second circuit terminal, with a first divider junction between the first and second capacitances and a second divider junction between the second and third capacitances;

wherein:
the first, second and third capacitances are each respectively a respective capacitance included in one of the switching units or a respective discrete capacitor separate from the switching units;
the first current input of the first switching unit is connected to the first divider junction;
the first current output of the first switching unit is connected to the first circuit terminal;
the first actuating terminal of the first switching unit is connected to the second actuating terminal of the second switching unit;
the second current input of the second switching unit is connected to the second circuit terminal;
the second current output of the second switching unit is connected to the second divider junction; and
the circuit signal output is connected to a switching unit signal output of one of the switching units or to the second divider junction.

Accordingly, the essence of the invention is to generate a time-limited signal in a circuit arrangement by means of a capacitive voltage divider and to reduce the flow of current in the circuit arrangement to zero after the signal has been generated. For this purpose, in order to generate a time-limited signal, at at least one signal output of a circuit arrangement, that has at least one first switching unit and one second switching unit each having an output and an input and a capacitive voltage divider with a first divider junction and a second divider junction, the circuit arrangement is put into a current-carrying state for just a limited period of time by applying the supply voltage and within this period of time a time-limited signal is fed to a signal output of the circuit arrangement. After applying the supply voltage, current flows from the first divider junction to the input of the first switching unit thereby discharging the first divider junction and during the discharging time the input of the second switching unit is activated by the output of the first switching unit and the second divider junction is charged by means of the output of the second switching unit and the time-limited signal is taken from a circuit junction within the circuit arrangement. The time-limited signal is determined here by the discharging time of the first divider junction and/or by the charging time of the second divider junction.

One advantage of the method is that the circuit arrangement consumes no further current after the time-limited signal has been generated. This allows a time-limited signal to be provided for further switching units without the initialization circuit increasing the current flow in the overall system after generation of the time-limited signal. The period over which current is input to the circuit arrangement is determined by the discharging times and the size of the capacitances of the capacitive voltage divider. Furthermore, within the period in which current is flowing in the circuit arrangement, it is possible to determine by the electrical parameters of the switching units the duration and rise behavior of the output signal. In addition, the duration of the output signal depends on the point at which the time-limited signal is output. Studies made by the applicant have shown that the method can be applied over a wide range of supply voltages, for instance between 3 and 60 volts, the maximum voltage depending on the electric strength of the components used in the circuit arrangement. Also, by disconnecting and reconnecting the circuit arrangement to the supply voltage, it is possible to generate several time-limited signals in succession. Moreover, by means of the voltage thresholds in the respective switching units, the time-limited signal can be generated reliably even at low supply voltages of, for example, 5 volts and lower and also when the supply voltage builds up slowly.

In a further development of the method, the second switching unit is activated by means of current from the first switching unit. This current is limited by a negative-feedback element in order to suppress overshoot and too rapid charging of the second divider junction. The limitation of the output current of the first switching unit can be performed either with a current source circuit or with a passive component such as a resistor In another development of the method, the voltage at the second divider junction that is pulled toward the supply voltage level by the charging current of the second circuit arrangement is limited to a preset potential by means of a voltage-limiting element. With high supply voltages in particular, for instance voltages above 60 volts, capacitors with a much lower electric strength (i.e. dielectric strength) can be used between the first divider junction and the second divider junction. In this case, it is advantageous to limit the voltage by means of a diode structure, preferably by means of a Zener diode.

In a further development of the method, current is caused to flow through a first current-controlled switch within the first switching unit by means of the first divider junction, and current is caused to flow to the second divider junction by means of a second current-controlled switch within the second switching unit. In this case, it is advantageous to limit the output current of the second switch by a resistor. Studies carried out by the applicant have shown that it is advantageous to feed out the time-limited signal by means of an additional driver transistor in order to avoid influencing the charging or discharging process between the two divider junctions. The driver transistor generates, for example, a time-limited current which can be transformed into a voltage signal by means of a resistor.

In another further development of the method, current is caused to flow from the first divider junction through a first current mirror within the first switching unit, and current is caused to flow to the second divider junction by means of a second current mirror within the second switching unit. An advantage of the current mirror circuit is that, as opposed to the current-controlled switches, it has no passive components and it can be produced in a small size and at low cost, particularly for small capacitances of the voltage divider. Furthermore, studies carried out by the applicant have shown that it is advantageous for one of the mirror circuits to be extended by means of an additional transistor to form a current bank in order to feed out the time-limited signal. In particular when using MOS transistors here, the current in the current mirrors is influenced only slightly. Furthermore, in a development of the method, the current mirror circuit in one switching unit can be combined with the current-controlled switch circuit in the other switching unit.

Other studies carried out by the applicant have shown that it is of advantage when the capacitor between the reference potential and the first divider junction and the capacitor between the supply voltage and the second divider junction are formed by the parasitic capacitances at the input and the output respectively of the switching units. Since only the capacitor between the first divider junction and the second divider junction is embodied in the form of a discrete passive component, the circuit arrangement can be produced with a small surface area and at low cost.

In a further development of the invention, the time-limited signal is fed out preferably at the second divider junction by means of a capacitive element, such as a capacitor for example. In this case, the current consumption of the circuit arrangement can be reduced and the additional driver transistor for driving the output is omitted.

BRIEF DESCRIPTION OF THE DRAWINGS

The method and the circuit arrangement according to the invention will now be explained with reference to several example embodiments in conjunction with schematic drawings. The drawings show.

DETAILED DESCRIPTION OF THE PREFERRED EMBODIMENTS OF THE INVENTION

Figure 1A:
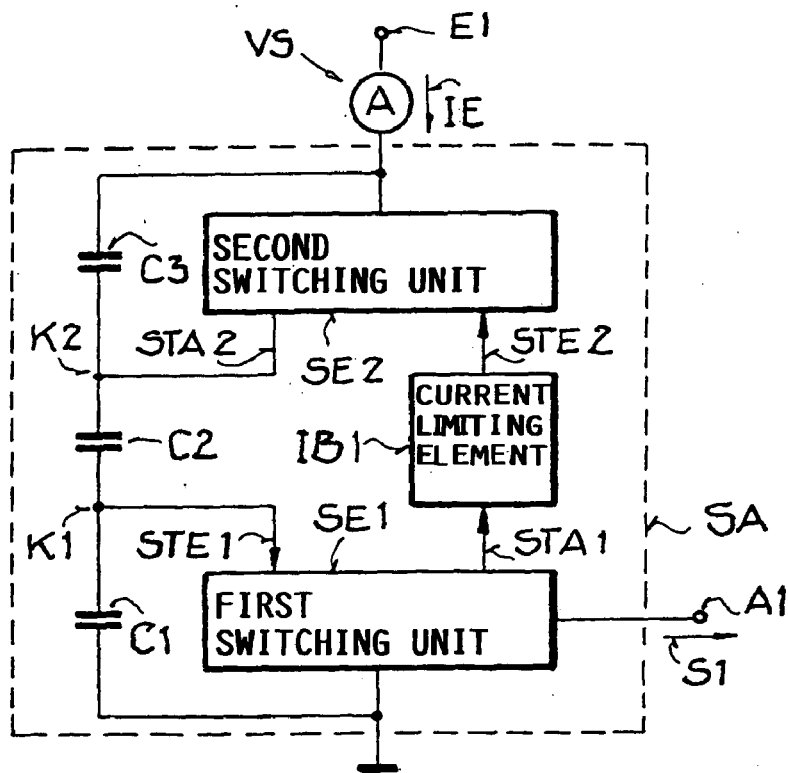
FIG. 1a a circuit arrangement with a capacitive circuit divider and two switching units, and FIG. 1b the relationship between the rise in voltage at the input of the circuit arrangement and the time-limited signal at the output of the circuit arrangement of FIG. 1a, and FIG. 2 a voltage-limiting element for protecting the circuit arrangement against overvoltage, and FIG. 3 an embodiment of the circuit arrangement with two current-controlled switches in the switching unit, and FIG. 4 an embodiment of the circuit arrangement with two current mirrors in the switching units, and FIG. 5 an embodiment of the circuit arrangement in which the input and output capacitance respectively of the current mirrors form a part of the capacitive voltage divider.

The circuit arrangement SA shown in FIG. 1a generates a time-limited signal S1 at an output A1 by applying a supply voltage VS to an input E1 of the circuit arrangement SA. After applying this supply voltage, a current IE flows through the circuit arrangement SA over a period of time ZG in which the time-limited signal S1 is fed in the output A1. After signal S1 has been generated, the circuit arrangement SA consumes no further current. The relationship in terms of time between the applying of the supply voltage VS and the rise of voltage UE1 at the input E1, as well as the current IE flowing into the input E1 and the signal S1 is shown schematically in FIG. 1b in a voltage/time diagram and a voltage or current/time diagram.

Here follows an explanation of the design of the circuit arrangement SA. The circuit arrangement SA has an input E1 to which a supply voltage VS is applied. The input E1 is connected to a series circuit comprising a capacitor C3, a capacitor C2 and a capacitor C1 which is connected to the reference potential. The series circuit of capacitors C1 to C3 forms a capacitive voltage divider with a first divider junction K1 between the capacitor C1 and the capacitor C2 and a second divider junction K2 between the capacitor C2 and the capacitor C3. Furthermore, the circuit arrangement SA has a first switching unit SE1 which is connected to the reference potential and a second switching unit SE2 which is connected to the input E1. Additionally, the first divider junction K1 is connected to an input STE1 of the first switching unit SE1 Also, the first switching unit SE1 has an output STA1 which is connected to an input STE2 of the second switching unit SE2 via a current-limiting element IB1 that is connected in series. In addition, the switching unit SE2 has an output STA2 which is connected to the second divider junction K2. Moreover, the first switching unit SE1 is connected to the output A1 by means of a signal output.

Figure 1B:
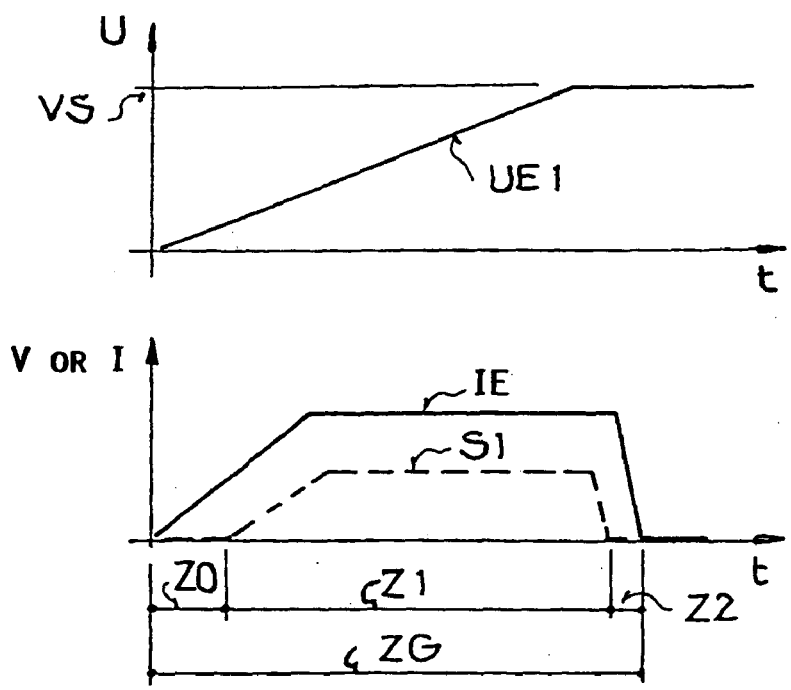
Figure 2:
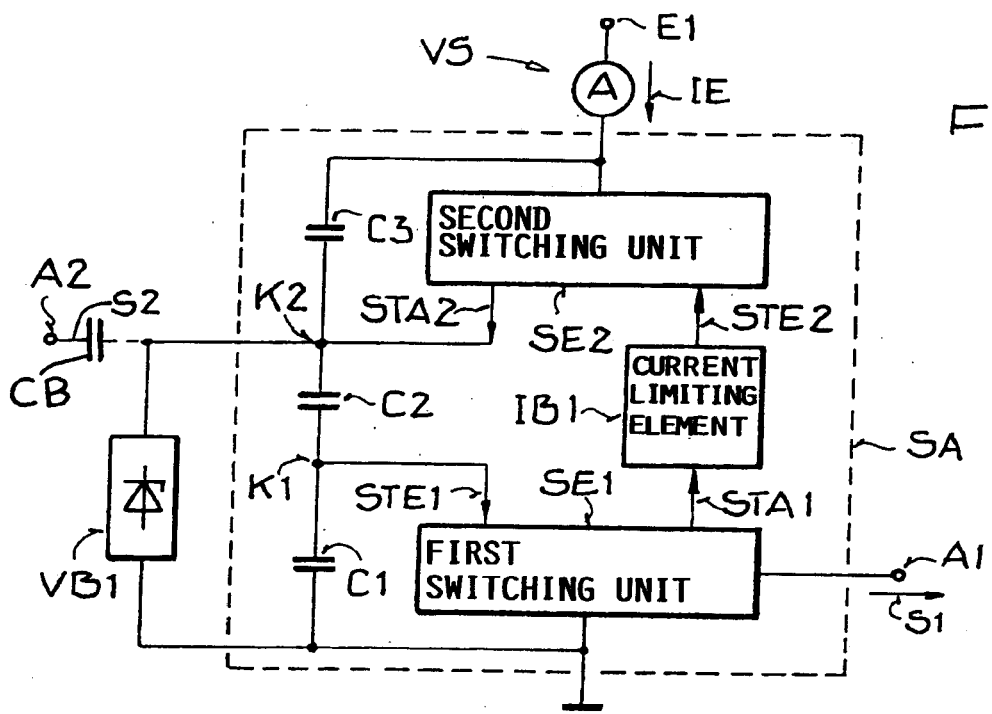
Figure 3:
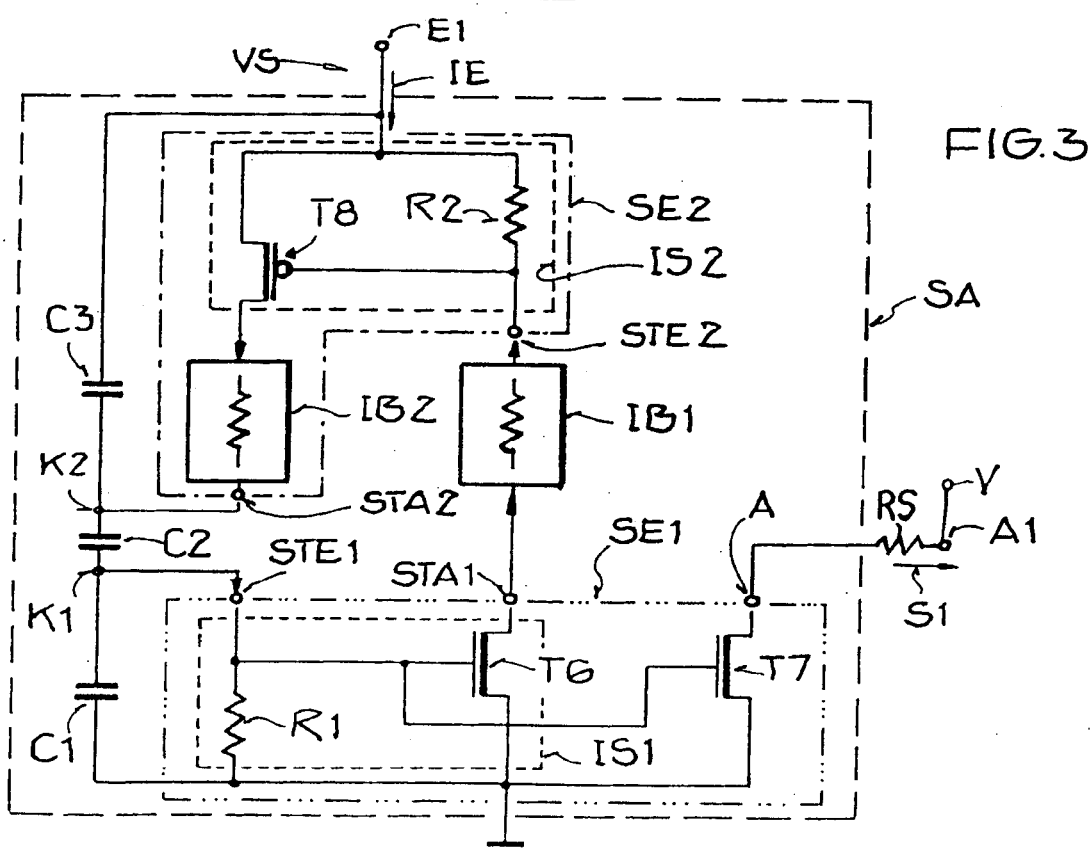
Figure 4:
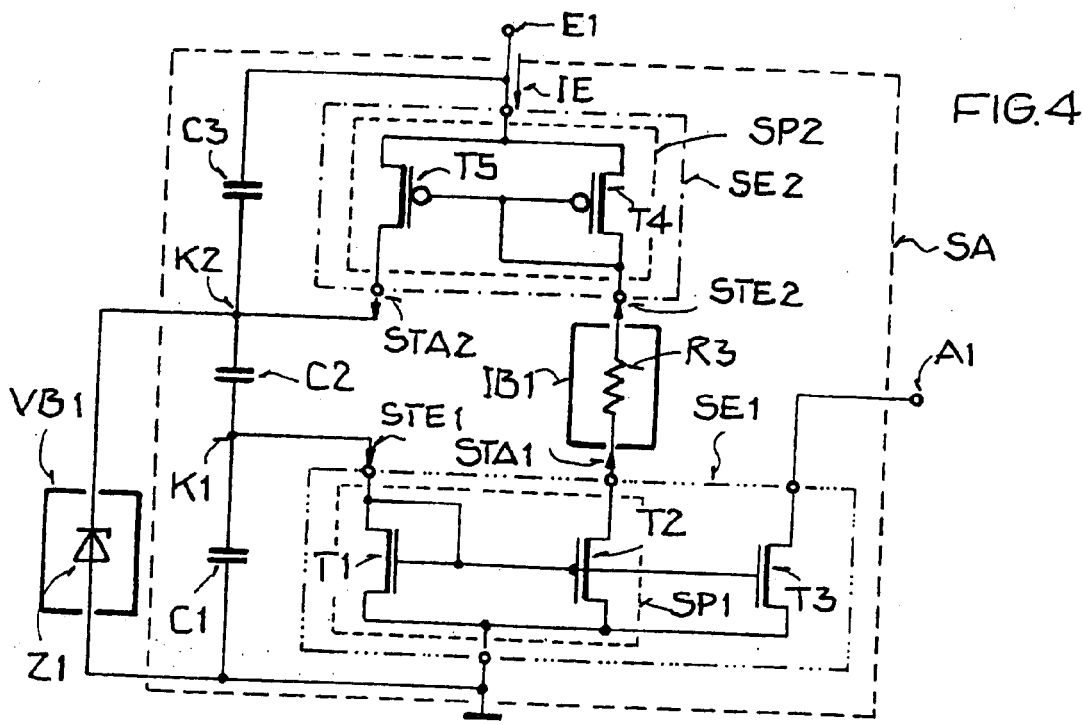
Figure 5:
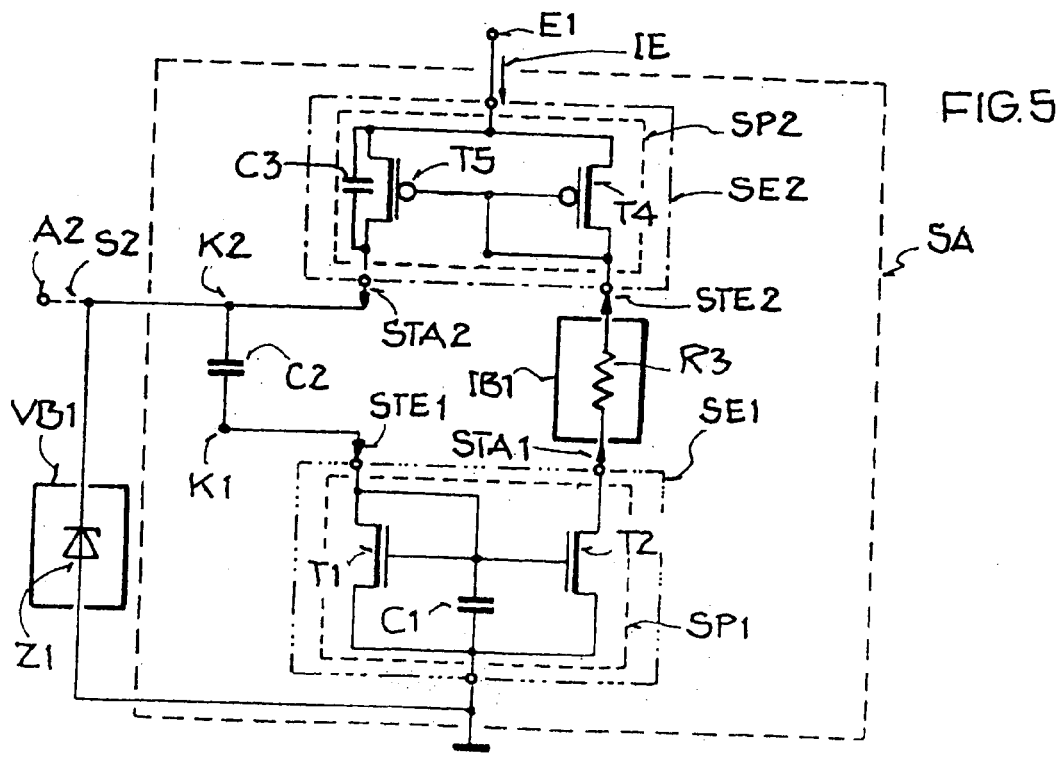

In the following, the mode of operation of the circuit arrangement SA will be explained with reference to the diagrams shown in FIG. 1b. After the supply voltage VS has been applied, the supply voltage UE1 at input E1 of the circuit arrangement SA rises slowly up to the level of the supply voltage VS, as shown in FIG. 1b, the difference in time between the level of the supply voltage VS and the rise of voltage UE1 being mainly due to parasitic resistances and inductances. Thereby, current flows through the capacitive voltage divider and the capacitors C1 to C3 and the divider junctions K1 and K2 are charged. From the divider junction K1, current flows to the input of the switching unit SE1 while the divider junction K1 is discharged. Subsequently, the switching unit SE1 activates a current to flow from the input STE2 of the switching unit SE2 via the current-limiting element IB1, which controls the switching unit SE2 to cause a current to flow via the output STA2 to the divider junction K2, which thereby additionally charges. Because of the current flowing through the circuit arrangement SA, the signal S1 is fed to the output A1 for a time Z1, as shown in FIG. 1b, after a time Z0 which is determined primarily by the divider ratios of the voltage divider and the voltage threshold values of the switching unit SE1. After a further time Z2, in which the signal S1 is no longer fed to the output A1, current ceases to flow through the circuit arrangement SA. The total time ZG, in which current flows through the switching unit SE1, is determined primarily by the discharge time of the divider junction K1. This discharge time is dependent on the magnitude of the further charging of the divider junction K2 and the current flowing through the input STE1 or alternatively by voltage thresholds within the switching unit SE1.

An advantage of the circuit arrangement SA is that the circuit arrangement SA draws current only within the period of time ZG. The time ZG is determined here by the effective RC times of the circuit arrangement SA and the magnitudes of the currents that flow through the two divider junctions K1 and K2. Furthermore, either a resistor or a current source can be used as negative-feedback element IB1 in the circuit arrangement SA in order to limit the current.

Figure 2:
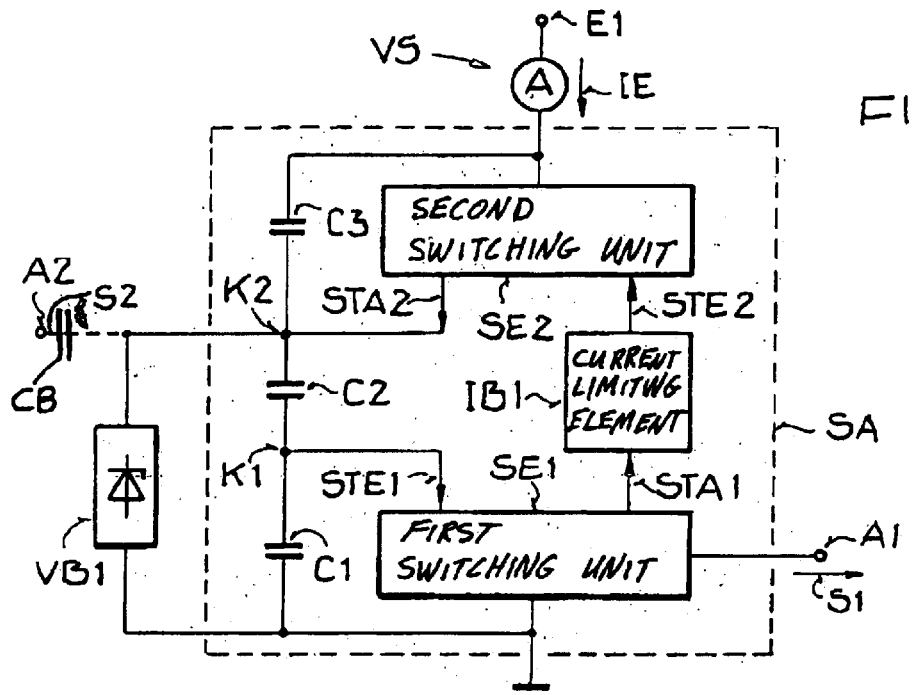

In the circuit arrangement SA for generating the time-limited signal S1, as shown in FIG. 2, the voltage at the divider junction K2 is limited by means of a voltage-limiting element VB1 which is connected to the reference potential. Furthermore, the circuit arrangement SA has another output A2 at which a time-limited signal S2 can be fed out, for instance via a capacitive element, preferably a blocking capacitor CB.

The explanations given below are in addition to what has been said with reference to the drawings of FIG. 1. Furthermore, above the voltage threshold of the voltage-limiting element VB1, which takes the form of a Zener diode for example, the current is diverted from the divider junction K2 and flows to the reference potential, which means that further charging of the divider junction K2 is suppressed. Once charging of the divider junction K2 has been completed, the divider junction K1 is no longer charged by the divider junction K2 and is therefore discharged faster by the switching unit SE1. Consequently, the time needed for the switching unit SE1 to trigger the switching unit SE2 is reduced. As a result, the time Z2 in particular and the time ZG, in which a time-limited signal S1 is fed to the output A1 and in which the current IE flows through the circuit arrangement SA, is reduced An advantage of the voltage-limiting element VB1 is that, especially at high supply voltages, the capacitor C2 need have only a low electric strength. Furthermore, the time ZG, in which the current IE flows through the circuit arrangement, can be changed by the voltage threshold of the voltage-limiting element VB1, the time ZG being proportional to the level of the voltage threshold of the voltage-limiting element VB1. Furthermore, when the time-limited signal S2 is fed out at output A2, the output A1 on the switching unit SE1 can be omitted.

Figure 3:
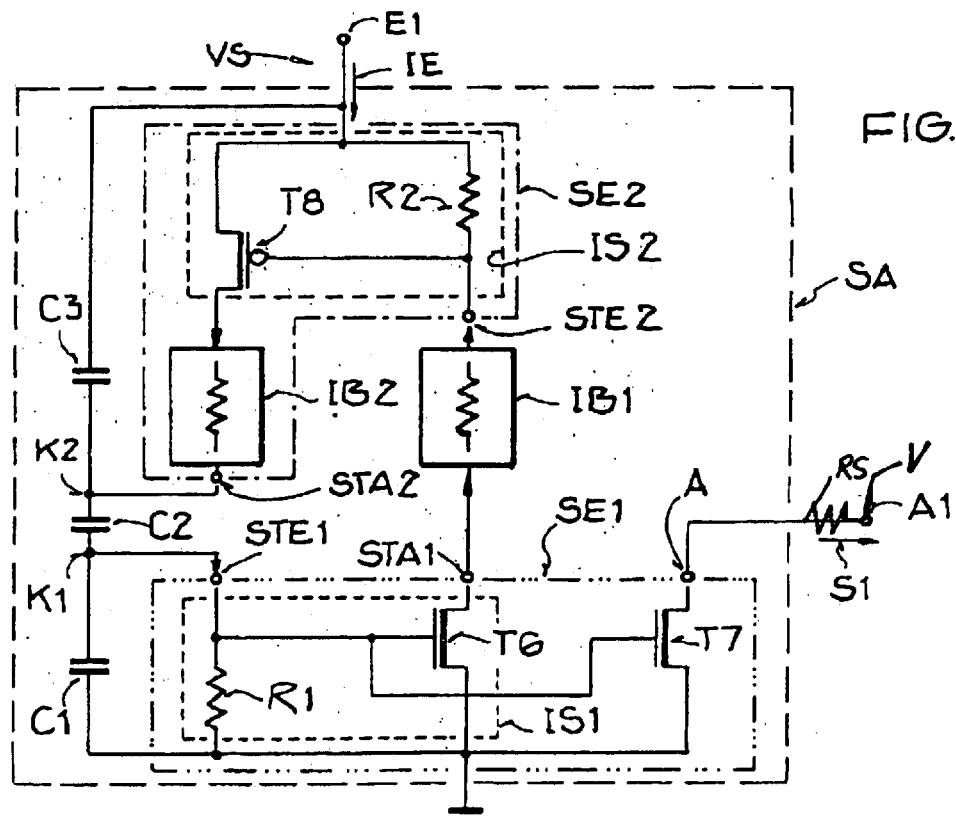

In the circuit arrangement SA shown in FIG. 3, the time-limited signal S1 is generated by the two switching units SE1 and SE2 by means of a first current-controlled switch IS1 and a second current-controlled switch IS2. Here, the output A1 is triggered with the signal S1 from switch 181 by means of a driver transistor T7, provided the output A1 is connected via a resistance element RS to a potential V that is above the reference potential. In addition, the output current of the switch IS2 is limited by means of an element IB2.

The circuit arrangement in the two switching units SE1 and SE2 will now be described in more detail. The input STE1 is connected to a resistor R1 that is connected to the reference potential, and to the control input of a transistor T6, and to the control input of the driver transistor T7. Also, the source of the transistor T6 and the source of the transistor T7 are each connected to the reference potential. The drain of the transistor T6 is connected to the output STA1 of the switching unit SE1 Furthermore, in the second switching unit SE2 the input STE2 is connected to a resistor R2, that is connected to the power supply VS, and to the control input of the transistor T8. The source of the transistor T8 is connected to the input E1. The drain of the transistor T8 is connected to the output STA2 via the current-limiting element IB2 which is provided, for example, in the form of a resistor.

The mode of operation of the two current-controlled switches IS1 and IS2 will now be explained below. After the supply voltage VS has been applied to the input E1, current flows through the resistor R1 in accordance with the potential at the divider junction K1, and consequently the transistor T6 or T7 respectively becomes conductive above the relevant threshold voltage due to the voltage drop across the resistor R1. Subsequently, current flows through transistor T7 between the output A1 and the reference potential. Furthermore, current flows from the input E1 via the resistor R2 through the transistor T6 to the reference potential. If the magnitude of the voltage drop across the resistor R2 is greater than the threshold voltage of transistor T8, current flows through the transistor T8 to the junction K2 via the output STA2. When the voltage at resistor R1 drops below the threshold voltage of the transistors T6 or T7 respectively, these transistors become non-conductive and thus no current flows through the resistor R2, i.e. the junction K2 is no longer charged via the output STA2, and no current flows at output A1.

An advantage of the particular design of the circuit arrangement SA is that in place of the first switch IS1, the second switch IS2 can also be connected to the output A1 via an additional driver transistor in order to thereby provide a time-limited signal for a following circuit stage.

Figure 4:
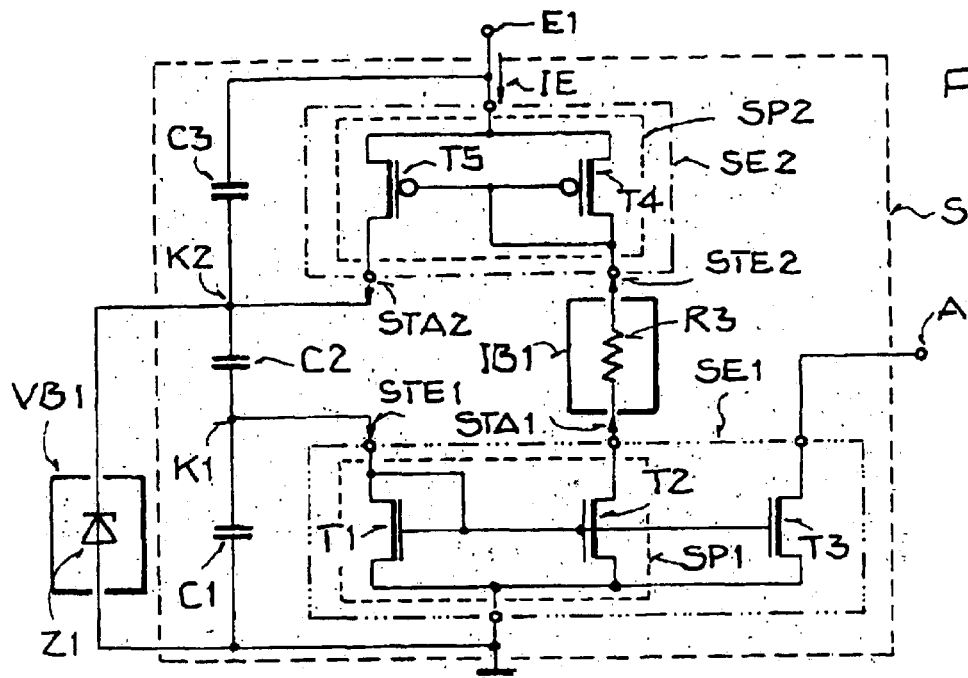

In FIG. 4, the time-limited signal S1 is generated by the two switching units SE1 and SE2 by means of a first current mirror SP1 and a second current mirror SP2. Signal S1 is sent here to the output A1 in the circuit arrangement SA from the current mirror SP1 via a driver transistor T3, provided a potential that is greater than the reference potential has been placed on output A1 via a resistance element. Furthermore, to limit the voltage at the capacitor C2, the divider junction K2 is connected to the voltage-limiting element VB1. The circuit arrangement in the two switching units SE1 and SE2 will now be described below.

The input of the first switching unit SE1 is connected to a NMOS transistor T1 that is connected as a diode, i.e. the drain and the gate of the transistor T1 are connected together. The source of the transistor T1 is connected to the reference potential and to the source of a NMOS transistor T2 and to the source of a NMOS transistor T3. The gate of the transistor T1 is connected to the gate of the transistor T2 and to the gate of the transistor T3. Furthermore, the drain of the transistor T2 is connected to the output STA1 of the switching unit. Also, the drain of the transistor T3 is connected to the output A1. In the switching unit SE2, the source of a PMOS transistor T4 and the source of a PMOS transistor T5 are connected to the input E1. Furthermore, the drain of the transistor T5 is connected to the output STA2 of the switching unit SE2. Also, the gate of the transistor T5 is connected to the gate of the transistor T4, to the drain of the transistor T4, and to the input STE2 of the switching unit SE2.

The mode of operation of the circuit arrangement SA will now be described below. After the supply voltage VS has been applied to the input E1, the transistor T1 becomes conductive once the voltage at the divider function K1 reaches the threshold voltage of the transistor T1. Also. if the voltage at the gate of the transistor T1 rises above the threshold voltage of the transistor T2 or of transistor T3 respectively, both transistors T2 and T3 respectively become conductive. Consequently current flows through the transistor T3 via the output A1. Furthermore, the current IE flows from the input E1 through the transistor T4 and the transistor T2. If the magnitude of the voltage drop across the transistor T4 is greater than the threshold voltage of the transistor T5, then the transistor T5 becomes conductive and the junction K2 receives current via the output STA2. If, due to the discharging of the divider function K1, the voltage at the transistor T1 drops below the threshold voltage of the transistor T2 or T3 respectively, current ceases to flow at the output A1 and through the transistor T4, i.e. the junction K2 is no longer charged via the output STA2.

An advantage of the current mirror arrangement is that this design of the circuit arrangement SA requires only a small chip surface and can be manufactured at an especially low cost. Furthermore, the circuit arrangement SA draws little current on account of the two current mirror circuits, the transistors of which can be activated, for example, in the subthreshold range. Together with small capacitances in the voltage divider, it is possible here to generate long time-limited signals.

Figure 5:
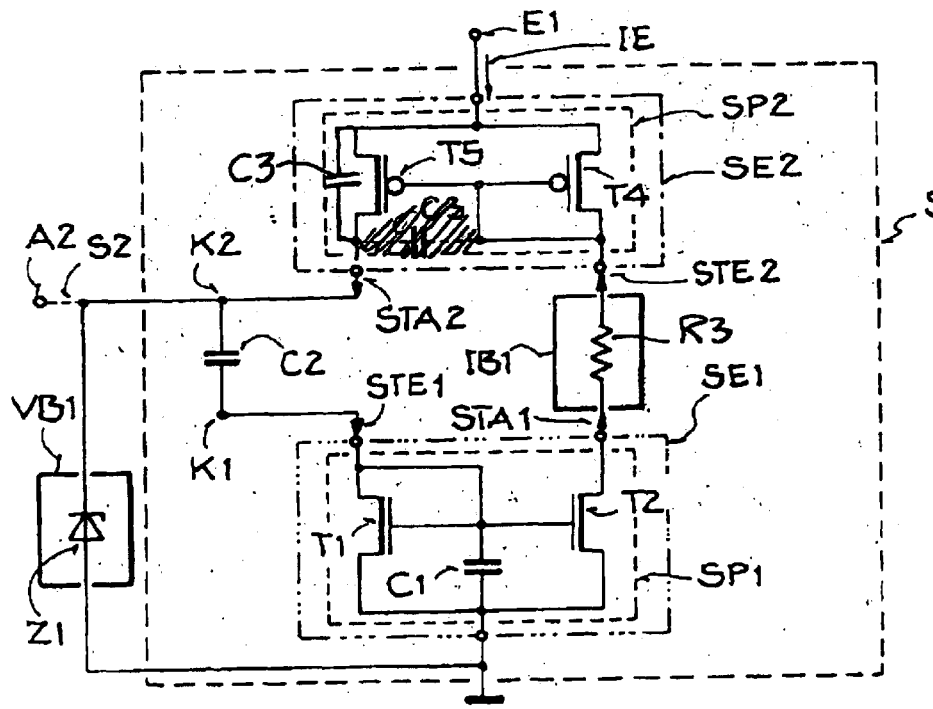

In FIG. 5, the time-limited signal S2 is generated by the two switching units SE1 and SE2 by means of the two current mirrors SP1 and SP2. The capacitors C1 and C3 are replaced here by the input capacitances and output capacitances respectively of the two switching units SE1 and SE2 and hence by the two current mirrors SP1 and SP2. In the following, reference will be made to the explanations concerning the drawings relating to FIG. 4, although in contrast to the circuit arrangement shown in FIG. 4 the voltage-limiting element VB1 is connected to the divider junction K2 and, by feeding out the signal S2 at the output A2, both the output A1 and the transistor T3 are omitted.

The mode of operation will now be explained. Because of the design of the capacitive circuit divider using the input capacitance of the switching unit SE1 and the output capacitance of the switching unit SE2, the total capacitance within the circuit arrangement is small and the current that flows in the input E1 after the supply voltage VS has been applied is very small since the charging and discharging currents are also small. In addition, the surface area of the transistors can be reduced considerably. In total, the chip area is reduced. Furthermore, due to the voltage-limiting element VB1 the demands with respect to electric strength are reduced. In particular with high supply voltages and technologies that provide only capacitors with a low specific capacitance, the integration capability of the circuit arrangement is enhanced.

An advantage of the method is that the circuit arrangement can be designed with both bipolar and MOS transistors. In addition, the method and the circuit arrangement can be applied over a wide range of supply voltages. Furthermore, by disconnecting from the supply voltage and then reconnecting to it, several successive time-limited signals can be generated, while the circuit arrangement draws no current after the time-limited signal has been generated.

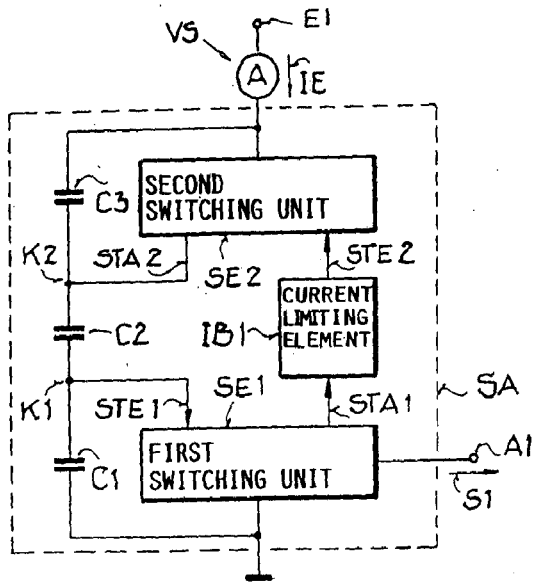

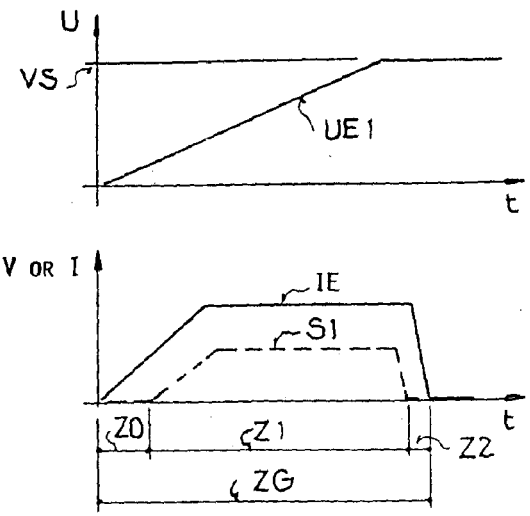

What is claimed is:

1. Method for generating a time-limited signal (S1) at least at one signal output (A1) of a circuit arrangement (SA) that has at least a first Switching unit (SE1) and a second switching unit (SE2) each having an output (STA1, STA2) and an input (STE1, STE2), and a capacitive voltage divider (C1, C2, C3) with a first divider junction (K1) and a second divider junction (K2), wherein:
the circuit arrangement (SA) creates a current-carrying condition for a specific period of time (Z1) as a result of applying the a supply voltage (VS) and within this time (Z1) the time-limited signal (S1) is fed to the signal output (A1) of the circuit arrangement (SA) in that
current flows from the first divider junction (K1) to the input (STE1) of the first switching unit (SE1) while at the same time the first divider junction (K1) discharges during a discharging time, and
within the discharging time the input (STE2) of the second switching unit (SE2) is activated by the output (STA1) of the first switching unit (SE1) and the second divider junction (K2) is charged via the output (STA2) of the second switching unit (SE2) during a charging time, and
at a circuit junction within the circuit arrangement (SA) the time-limited signal (S1) is fed out, and
the time-limited signal (S1) is determined by the discharging time of the first divider junction (K1) and/or by the charging time of the second divider junction (K2).

2. Circuit arrangement (SA) for performing a method for generating a time-limited signal (S1) with a first switching unit (SE1) that has a current input (STE1) and an actuating terminal (STA1), a second switching unit (SE2) that has an actuating terminal (STE2) and a current output (STA2), a first capacitive element (C1), a second capacitive element (C2), a third capacitive element (C3) and a signal output (A1), wherein:
the three capacitive elements (C1, C2, C3) are connected in series as a capacitive voltage divider,
the current input (STE1) of the first switching unit (SE1) is connected to a first divider junction (K1) of the capacitive voltage divider,
the current output (STA2) of the second switching unit (SE2) is connected to a second divider junction (K2) of the capacitive voltage divider,
the actuating terminal (STA1) of the first switching unit (SE1) is connected to the actuating terminal (STE2) of the second switching unit (SE2), and
the signal output (A1) of the circuit arrangement (SA) is connected to err another output (A) of the first switching unit (SE1).

3. A method of generating a time-limited signal, comprising the steps:
a) applying a supply voltage to a capacitive voltage divider including first and second divider junctions between first, second and third capacitances in series, thereby charging said voltage divider while establishing a first voltage at said first divider junction and a second voltage at said second divider junction;
b) at least partially discharging said first divider junction;
c) in response to and dependent on a varying first voltage level of said first voltage being no less than a first voltage threshold, selectively applying an additional charging current to said second divider junction in addition to said charging of said voltage divider; and
d) generating a time-limited signal in response to and dependent on at least one of:
i) said first voltage level of said first voltage, and
ii) a charging rate of a second voltage level of said second voltage.

4. The method according to claim 3, wherein said applying of said additional charging current to said second divider junction provides a positive feedback to supplement said charging of said voltage divider so as to increase said charging rate of said second voltage level.

5. The method according to claim 3, carried out in a circuit arrangement including said capacitive voltage divider, said method further comprising drawing a supply current with said circuit arrangement only during a limited time period, carrying out said steps a), b), c) and d) within said limited time period, and ceasing to draw current with said circuit arrangement after an end of said limited time period until initiating a beginning of another one of said limited time period.

6. The method according to claim 3, wherein said step d) comprises generating said time-limited signal in response to and dependent on said first voltage level of said first voltage being no less than a second voltage threshold that may or may not correspond to said first voltage threshold.

7. The method according to claim 6, wherein said generating of said time-limited signal comprises applying said first voltage to a control input of a driver transistor so as to switch said transistor to a conductive state and thereby generate said time-limited signal from a current flowing through said drive transistor while said first voltage level is no less than said second voltage threshold which is a voltage threshold of said driver transistor.

8. The method according to claim 3, wherein said step d) comprises generating said time-limited signal in response to and dependent on said charging rate of said second voltage level of said second voltage.

9. The method according to claim 8, wherein said step d) comprises generating said time-limited signal during a charging time of said second divider junction while said charging rate is positive.

10. The method according to claim 8, wherein said generating of said time-limited signal comprises tapping said time-limited signal from said second divider junction through at least a blocking capacitive element.

11. The method according to claim 3, wherein said selective applying of said additional charging current to said second divider junction is activated and controlled by a control current that is caused to flow when said first voltage level of said first voltage is no less than said first voltage threshold, and further comprising limiting said control current through a negative feedback element.

12. The method according to claim 3, further comprising limiting said second voltage level so as not to exceed a maximum voltage limit.

13. The method according to claim 3, further comprising limiting said additional charging current through a current-limiting element.

14. The method according to claim 3, wherein said step d) comprises generating said time-limited signal with a current mirror that is extended by an additional transistor to form a current bank.

15. The method according to claim 3, further comprising applying said time-limited signal as a reset signal to a circuit that is to be reset.

16. A circuit arrangement for generating a time-limited signal at a circuit signal output thereof, said circuit arrangement comprising:
a first circuit terminal, a second circuit terminal, and said circuit signal output;
a first switching unit including a first current input, a first current output, and a first actuating terminal;
a second switching unit including a second current input, a second current output, and a second actuating terminal; and
a capacitive voltage divider including first, second and third capacitances that are connected in series with one another between said first circuit terminal and said second circuit terminal, with a first divider junction between said first and second capacitances and a second divider junction between said second and third capacitances;
wherein:
said first, second and third capacitances are each respectively a respective capacitance included in one of said switching units or a respective discrete capacitor separate from said switching units;
said first current input of said first switching unit is connected to said first divider junction;
said first current output of said first switching unit is connected to said first circuit terminal;
said first actuating terminal of said first switching unit is connected to said second actuating terminal of said second switching unit;
said second current input of said second switching unit is connected to said second circuit terminal;
said second current output of said second switching unit is connected to said second divider junction; and
said circuit signal output is connected to a switching unit signal output of one of said switching units or to said second divider junction.

17. The circuit arrangement according to claim 16, being adapted and designed to have said first circuit terminal connected to a reference potential and said second circuit terminal connected to a supply voltage.

18. The circuit arrangement according to claim 16, wherein said circuit signal output is connected to said switching unit signal output of said first switching unit.

19. The circuit arrangement according to claim 18, wherein said first switching unit includes a driver transistor that has a transistor control terminal connected to said first current input and that has a controlled conduction path connected between said switching unit signal output and said first current output.

20. The circuit arrangement according to claim 16, wherein said circuit signal output is connected to said second divider junction.

21. The circuit arrangement according to claim 20, further comprising a blocking capacitor interposed between said circuit signal output and said second divider junction, so that said circuit signal output is connected to said second divider junction through said blocking capacitor.

22. The circuit arrangement according to claim 16, wherein said first, second and third capacitances respectively comprise discrete first, second and third capacitors separate from said first and second switching units.

23. The circuit arrangement according to claim 16, wherein said first capacitance is a parasitic capacitance included internally in said first switching unit, said second capacitance is a discrete capacitor separate from said first and second switching units, and said third capacitance is another parasitic capacitance included internally in said second switching unit.

24. The circuit arrangement according to claim 16, further comprising a current-limiting element interposed and connected between said first actuating terminal of said first switching unit and said second actuating terminal of said second switching unit.

25. The circuit arrangement according to claim 24, wherein said current-limiting element comprises a resistor.

26. The circuit arrangement according to claim 16, further comprising a voltage-limiting element connected to said second divider junction.

27. The circuit arrangement according to claim 26, wherein said voltage-limiting element comprises a Zener diode.

28. The circuit arrangement according to claim 16, wherein said first switching unit comprises a first current-controlled switch and a driver transistor that is connected to said switching unit signal output of said first switching unit, which is connected to said circuit signal output, and said second switching unit comprises a second current-controlled switch and a current-limiting element connected between said second current-controlled switch and said second current output of said second switching unit.

29. The circuit arrangement according to claim 28, wherein said first current-controlled switch comprises at least one switching transistor connected in a grounded-emitter or grounded-source circuit between said first actuating terminal and said first current output.

30. The circuit arrangement according to claim 16, wherein said first switching unit comprises a first current mirror, said second switching unit comprises a second current mirror, and one of said switching units further comprises a driver transistor by which said one of said switching units is connected via said switching unit signal output thereof to said circuit signal output.

31. The circuit arrangement according to claim 16, wherein one of said switching units comprises a current-mirror circuit and another of said switching units comprises a current-controlled switch.

32. The circuit arrangement according to claim 16, wherein:
    said first capacitance is a parasitic capacitance included internally in said first switching unit, said second capacitance is a discrete capacitor separate from said first and second switching units, and said third capacitance is another parasitic capacitance included internally in said second switching unit;
    said first switching unit comprises a first transistor with a control terminal thereof connected to said first current input and a controlled conduction path thereof connected between said first current input and said first current output;
    said first switching unit further comprises a second transistor with a control terminal thereof connected to said first current input and a controlled conduction path thereof connected between said first actuating terminal and said first current output;
    said second switching unit comprises a third transistor with a control terminal thereof connected to said second actuating terminal and a controlled conduction path thereof connected between said second current input and said second current output; and
    said second switching unit further comprises a fourth transistor with a control terminal thereof connected to said second actuating terminal and a controlled conduction path thereof connected between said second current input and said second actuating terminal.

33. The circuit arrangement according to claim 32, further comprising a Zener diode connected between said second divider junction and said first circuit terminal.

* * * * *

UNITED STATES PATENT AND TRADEMARK OFFICE
CERTIFICATE OF CORRECTION

| | |
|---|---|
| PATENT NO. | : 6,806,749 B2 |
| APPLICATION NO. | : 10/242880 |
| DATED | : October 19, 2004 |
| INVENTOR(S) | : Ullrich Drusenthal |

It is certified that error appears in the above-identified patent and that said Letters Patent is hereby corrected as shown below:

The title page should be deleted and substitute therefore the attached title page.

Drawings:

Replace Figs. 1a, 1b, 2, 3, 4 and 5 with the attached replacement sheets of Figs. 1a, 1b, 2 3, 4 and 5 as shown on the attached pages.

Column 5,
Line 60, after "of", replace "Fig. 1." by --Fig. 2.--;

Column 6,
Line 22, after "switch", replace "181" by --IS1--;

Column 7,
Line 35, after "Also", replace "." by --,--;

Column 8,
Line 32, after "first", replace "Switching" by --switching--;

Column 9,
Line 14, after "to", delete --err--;

Column 10,
Line 15, after "exceed a", insert "--preset--.

Signed and Sealed this

Seventeenth Day of October, 2006

JON W. DUDAS
*Director of the United States Patent and Trademark Office*

United States Patent
Drusenthal

(10) Patent No.: US 6,806,749 B2
(45) Date of Patent: Oct. 19, 2004

(54) CIRCUIT ARRANGEMENT AND METHOD FOR GENERATING A TIME-LIMITED SIGNAL

(75) Inventor: Ullrich Drusenthal, Heilbronn (DE)

(73) Assignee: Atmel Germany GmbH, Heilbronn (DE)

(*) Notice: Subject to any disclaimer, the term of this patent is extended or adjusted under 35 U.S.C. 154(b) by 0 days.

(21) Appl. No.: 10/242,880

(22) Filed: Sep. 12, 2002

(65) Prior Publication Data

US 2003/0058033 A1 Mar. 27, 2003

(30) Foreign Application Priority Data

Sep. 24, 2001 (DE) .......................................... 101 46 831

(51) Int. Cl.⁷ ........................... H03K 17/22; H03K 3/355
(52) U.S. Cl. ........................ 327/143; 327/198; 327/227
(58) Field of Search ............................. 327/143, 198, 327/227, 544, 545, 546

(56) References Cited

U.S. PATENT DOCUMENTS

| | | | |
|---|---|---|---|
| 4,405,871 A | * 9/1983 | Buurma et al. | 327/143 |
| 4,409,501 A | 10/1983 | Eickerman et al. | 327/143 |
| 5,017,803 A | * 5/1991 | Yoshida | 327/546 |
| 5,321,317 A | * 6/1994 | Pascucci et al. | 327/143 |
| 5,612,641 A | * 3/1997 | Sali | 327/143 |
| 5,812,001 A | 9/1998 | Imamiya | 327/198 |

FOREIGN PATENT DOCUMENTS

| | | | | |
|---|---|---|---|---|
| DE | 10024980 | 11/2001 | | H03K/17/22 |
| WO | WO 99/27652 | 6/1999 | | H03L/7/00 |

* cited by examiner

*Primary Examiner*—Timothy P. Callahan
*Assistant Examiner*—Terry L. Englund
(74) *Attorney, Agent, or Firm*—W. F. Fasse; W. G. Fasse

(57) ABSTRACT

A circuit includes a second switching unit, a first switching unit that is connected to and selectively actuates the second switching unit, and a capacitive voltage divider including first, second and third capacitances connected in series. The first and second switching units are connected respectively to first and second junctions between the first and second and the second and third capacitances respectively. An associated method involves applying a supply voltage to the voltage divider so as to charge the first and second junctions, discharging the first junction through the first switching unit, which, dependent on the voltage of the first junction, selectively actuates the second switching unit to supply an additional charging current to the second junction. A time-limited signal such as a power-on reset signal is tapped from the first or second switching unit or from the second junction. Thereafter, the circuit draws no further current.

33 Claims, 3 Drawing Sheets